(12) United States Patent
Chou

(10) Patent No.: US 11,423,982 B2
(45) Date of Patent: *Aug. 23, 2022

(54) RESISTIVE MEMORY DEVICE WITH TRIMMABLE DRIVER AND SINKER AND METHOD OF OPERATIONS THEREOF

(71) Applicant: TAIWAN SEMICONDUCTOR MANUFACTURING CO., LTD., Hsinchu (TW)

(72) Inventor: Chung-Cheng Chou, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/932,736

(22) Filed: Jul. 18, 2020

(65) Prior Publication Data

US 2020/0350010 A1 Nov. 5, 2020

Related U.S. Application Data

(63) Continuation of application No. 16/105,527, filed on Aug. 20, 2018, now Pat. No. 10,726,916, which is a continuation of application No. 15/415,788, filed on Jan. 25, 2017, now Pat. No. 10,062,434, which is a continuation of application No. 15/065,787, filed on Mar. 9, 2016, now Pat. No. 9,679,643.

(51) Int. Cl.
*G11C 8/00* (2006.01)
*G11C 13/00* (2006.01)
*G11C 11/16* (2006.01)

(52) U.S. Cl.
CPC .............. *G11C 13/004* (2013.01); *G11C 8/00* (2013.01); *G11C 11/1653* (2013.01); *G11C 11/1673* (2013.01); *G11C 11/1675* (2013.01); *G11C 13/0007* (2013.01); *G11C 13/0023* (2013.01); *G11C 13/0033* (2013.01); *G11C 13/0069* (2013.01); *G11C 2013/0054* (2013.01); *G11C 2213/79* (2013.01); *G11C 2213/82* (2013.01)

(58) Field of Classification Search
CPC . G11C 13/004; G11C 11/161; G11C 13/0023; G11C 13/0069
See application file for complete search history.

(56) References Cited

U.S. PATENT DOCUMENTS

| 6,947,317 B2 | 9/2005 | Iwate |
| 7,064,975 B2 | 6/2006 | Iwata |
| 7,116,598 B2 | 10/2006 | Shimizu et al. |

(Continued)

FOREIGN PATENT DOCUMENTS

| WO | 2006/112049 A1 | 10/2006 |
| WO | 2015/136740 A1 | 9/2015 |

*Primary Examiner* — Mushfique Siddique
(74) *Attorney, Agent, or Firm* — Maschoff Brennan

(57) ABSTRACT

A device is disclosed. The device includes a first memory cell, a second memory cell, a first pair of a driver and a sinker, and a second pair of a driver and a sinker. The first memory cell is coupled between the first pair of the driver and the sinker through a first line and a second line. The second memory cell is coupled between the second pair of the driver and the sinker through a third line and a fourth line. The first pair of the driver and the sinker are configured to be controlled to have resistances depending on a row location of the first memory cell in a memory column.

20 Claims, 9 Drawing Sheets

(56) References Cited

U.S. PATENT DOCUMENTS

| | | |
|---|---|---|
| 7,355,884 B2 | 4/2008 | Nakayama et al. |
| 7,457,150 B2 | 11/2008 | Tsuchida et al. |
| 7,514,989 B1 | 4/2009 | Somerville et al. |
| 7,903,448 B2 | 3/2011 | Oh et al. |
| 7,864,563 B2 | 6/2011 | Takizawa et al. |
| 7,969,768 B2 | 6/2011 | Takizawa et al. |
| 8,009,456 B2 | 8/2011 | Shimomura et al. |
| 8,811,059 B2 | 8/2014 | Rho |
| 9,001,559 B2 | 4/2015 | Takahashi et al. |
| 9,177,641 B2 | 11/2015 | Takahshi et al. |
| 9,202,561 B1 | 12/2015 | Park et al. |
| 9,257,178 B1 | 2/2016 | Chou |
| 9,324,426 B2 | 4/2016 | Jang et al. |
| 9,378,819 B2 | 6/2016 | Park |
| 9,443,585 B2 | 9/2016 | Takahashi |
| 9,679,643 B1 | 6/2017 | Chou |
| 2003/0090934 A1 | 5/2003 | Iwata |
| 2003/0123271 A1 | 7/2003 | Iwata |
| 2004/0001353 A1 | 1/2004 | Hidaka |
| 2004/0228198 A1 | 11/2004 | Shimizu |
| 2004/0252551 A1 | 12/2004 | Iwata et al. |
| 2005/0157541 A1 | 7/2005 | Iwata |
| 2009/0010045 A1* | 1/2009 | Ueda .................. G11C 11/15 365/158 |
| 2009/0180310 A1* | 7/2009 | Shimomura ....... G11C 13/0007 365/148 |
| 2009/0225586 A1* | 9/2009 | Ueda .................. G11C 7/065 365/158 |
| 2010/0034009 A1 | 2/2010 | Lu et al. |
| 2010/0110785 A1 | 5/2010 | Chen et al. |
| 2010/0118588 A1 | 5/2010 | Chen |
| 2010/0165701 A1 | 7/2010 | Ueda |
| 2011/0305068 A1 | 12/2011 | Kitagawa et al. |
| 2011/0317482 A1 | 12/2011 | Pyeon |
| 2012/0086476 A1 | 4/2012 | Yuh et al. |
| 2013/0021844 A1* | 1/2013 | Pyeon ................ G11C 13/0004 365/163 |
| 2013/0094277 A1 | 4/2013 | Rho |
| 2014/0043887 A1 | 2/2014 | Lym et al. |
| 2014/0177353 A1 | 6/2014 | Park |
| 2014/0219002 A1 | 8/2014 | Lee et al. |
| 2014/0241042 A1* | 8/2014 | Park ................... G11C 13/0007 365/148 |
| 2014/0285226 A1 | 9/2014 | Li |
| 2014/0286075 A1 | 9/2014 | Katayama et al. |
| 2014/0286080 A1 | 9/2014 | Takahashi et al. |
| 2014/0286081 A1 | 9/2014 | Takahashi et al. |
| 2014/0286082 A1 | 9/2014 | Takahashi et al. |
| 2014/0286088 A1 | 9/2014 | Takahashi et al. |
| 2015/0055397 A1 | 2/2015 | Yi et al. |
| 2015/0070971 A1 | 3/2015 | Katayama et al. |
| 2015/0206583 A1 | 7/2015 | Chou et al. |
| 2015/0269996 A1 | 9/2015 | Takahashi |
| 2015/0302925 A1 | 10/2015 | Oh et al. |
| 2016/0042788 A1 | 2/2016 | Ahn |
| 2016/0064452 A1 | 3/2016 | Ueda et al. |
| 2016/0071583 A1 | 3/2016 | Murooka |
| 2016/0181319 A1 | 6/2016 | Tanaka et al. |
| 2016/0182044 A1 | 6/2016 | Addepalli et al. |

* cited by examiner

RESISTIVE MEMORY DEVICE WITH TRIMMABLE DRIVER AND SINKER AND METHOD OF OPERATIONS THEREOF

RELATED APPLICATIONS

This application is a continuation of U.S. application Ser. No. 16/105,527, filed Aug. 20, 2018, now U.S. Pat. No. 10,726,916, issued on Jul. 28, 2020, which is a continuation of U.S. application Ser. No. 15/415,788, filed Jan. 25, 2017, now U.S. Pat. No. 10,062,434, issued on Aug. 28, 2018, which is a continuation of U.S. application Ser. No. 15/065,787, filed Mar. 9, 2016, now U.S. Pat. No. 9,679,643, issued on Jun. 13, 2017. All of these applications are incorporated herein by reference in their entireties.

BACKGROUND

Resistive memory device has been widely used due to the properties, including, for example, high stability, high reliability, simple structure, and compatibility with complementary metal-oxide-semiconductor (CMOS) process. The resistive memory device is a memory device which can store data by applying voltages with different polarities and levels to change resistance of resistive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
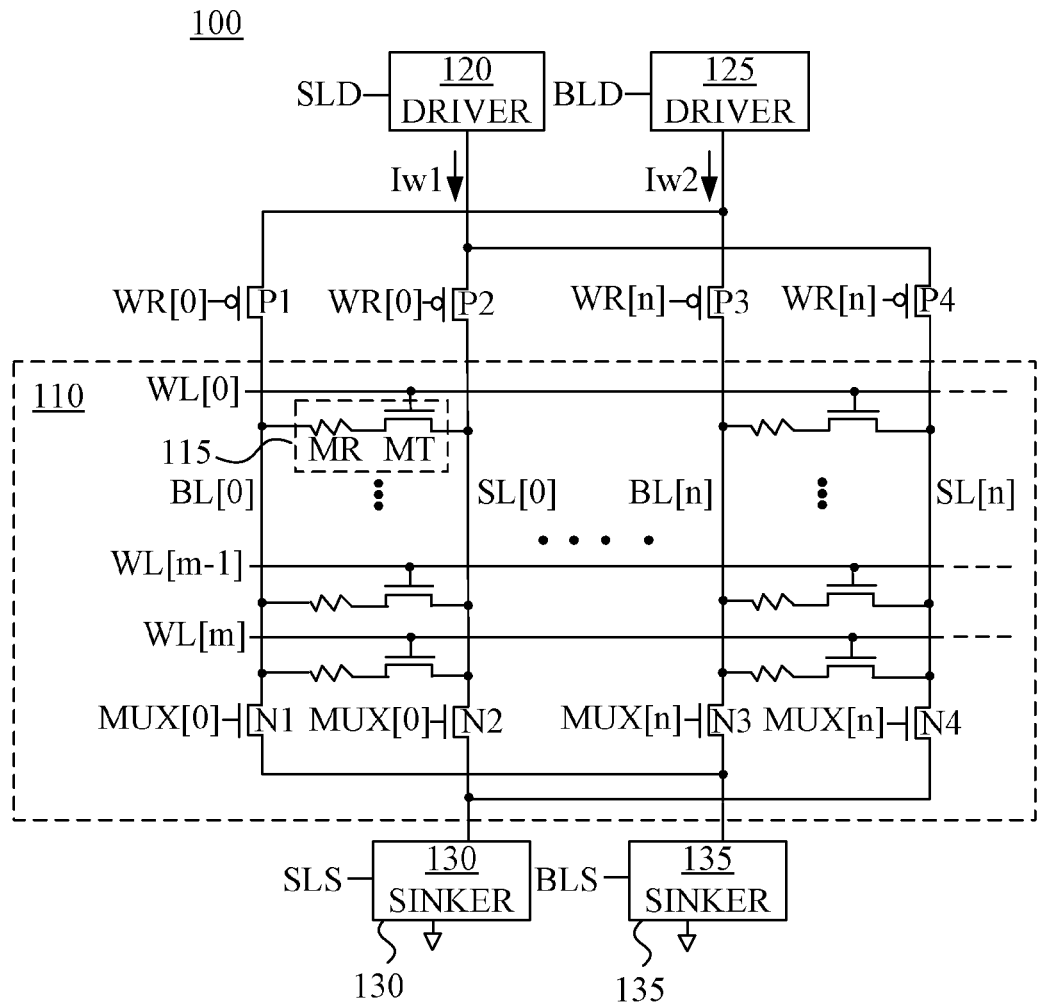
FIG. 1 is a circuit diagram of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Reference is now made to FIG. 1. FIG. 1 is a circuit diagram of a memory device 100 in accordance with various embodiments of the present disclosure.

For illustration, the memory device 100 includes a memory array 110 arranged in rows and columns. The memory array 110 includes a plurality of resistive memory cells 115 each disposed at an intersection of one of the memory rows and one of the memory columns. For simplicity, only one resistive memory cell 115 is labeled in FIG. 1. The like resistive memory cells in FIG. 1 are also each referred to as the resistive memory cell 115.

In some embodiments, each of the resistive memory cells 115 is a magnetoresistive random-access memory (MRAM), and in some other embodiments, each of the resistive memory cells 115 is a resistive random-access memory (RRAM). In some embodiments, each of the resistive memory cells 115 is an architecture of one transistor and one resistor (1T1R). Illustratively, each of the resistive memory cells 115 is exemplarily illustrated as a transistor MT and a resistor MR electrically connected in series in FIG. 1.

Each of the resistive memory cells 115 has a high resistance state and a low resistance state that are interchangeable based on a write operation performed thereon. For illustration, the resistance of each of the resistive memory cells 115 under the high resistance state, which is also referred to as "high state resistance," is higher than its resistance under the low resistance state, which is also referred to as "low state resistance." In operation, the resistance state of the resistive memory cells 115 is modified by a write current applied thereon.

The type and configuration of the resistive memory cells 115 illustrated in FIG. 1 are given for illustrative purposes. Various types and configurations of the resistive memory cells 115 are within the contemplated scope of the present disclosure.

In some embodiments, the memory device 100 further includes a driver 120, a driver 125, a sinker 130 and a sinker 135. For illustration, each of the resistive memory cells 115 in one of the memory columns is electrically connected to the driver 120 through, for illustration, one of the source lines SL[0], . . . and SL[n]. Furthermore, each of the resistive memory cells 115 in one of the memory columns is electrically connected to the sinker 135 through, for illustration, one of the bit lines BL[0], . . . and BL[n].

In some embodiments, each of the resistive memory cells 115 in one of the memory columns is also electrically connected to the driver 125 through, for illustration, one of the bit lines BL[0], . . . and BL[n]. Furthermore, each of the resistive memory cells 115 in one of the memory columns is also electrically connected to the sinker 130 through, for illustration, one of the source lines SL[0], . . . and SL[n].

For illustration of the resistive memory cell 115 labeled in FIG. 1, the resistive memory cell 115 is electrically connected to the driver 120 and the sinker 135 through the source line SL[0] and the bit line BL[0], respectively. Furthermore, the resistive memory cell 115 labeled in FIG. 1 is also electrically connected to the driver 125 and the sinker 130 through the bit line BL[0] and the source line SL[0], respectively. The resistive memory cell 115 labeled in FIG. 1 is given for illustration. The like resistive memory cells in FIG. 1 are configured like the resistive memory cell 115 labeled in FIG. 1, and they are not further detailed for simplicity of illustration.

In some embodiments, the memory device 100 further includes groups of switches, and each group corresponds to one column of resistive memory cells 115. For illustration in FIG. 1, the group of switches P1, P2, N1 and N2 corresponds to the memory column electrically connected to the bit line BL[0] and the source line SL[0]. The group of switches P3, P4, N3 and N4 corresponds to the memory column electrically connected to the bit line BL[n] and the source line SL[n]. Each group of switches mentioned above is configured for selecting the corresponding column to perform write operation.

For illustration in FIG. 1, the switch P1 is electrically connected between the driver 125 and the bit line BL[0]. The switch P2 is electrically connected between the driver 120 and the source line SL[0]. Both of the switch P1 and the switch P2 are under the control of a selection signal WR[0].

The switch N1 is electrically connected between the sinker 135 and the bit line BL[0]. The switch N2 is electrically connected between the sinker 130 and the source line SL[0]. Both of the switch N1 and the switch N2 are under the control of a selection signal MUX[0].

In some embodiments, the switches P1 and P2 are P-type transistors and the switches N1 and N2 are N-type transistors. In operation, when the selection signal WR[0] is at a low state and the selection signals MUX[0] is at a high state, the switches P1, P2, N1 and N2 are conducted. Accordingly, the column of the resistive memory cells 115 corresponding to the bit line BL[0] and the source line SL[0] is selected to perform the write operation.

For another illustration, the switch P3 is electrically connected between the driver 125 and the bit line BL[n]. The switch P4 is electrically connected between the driver 120 and the source line SL[n]. Both of the switch P3 and the switch P4 are under the control of a selection signal WR[n].

The switch N3 is electrically connected between the sinker 135 and the bit line BL[n]. The switch N4 is electrically connected between the sinker 130 and the source line SL[n]. Both of the switch N3 and the switch N4 are under the control of a selection signal MUX[n].

In some embodiments, the switches P3 and P4 are P-type transistors and the switches N3 and N4 are N-type transistors. In operation, when the selection signal WR[n] is at a low state and the selection signals MUX[n] is at a high state, the switches P3, P4, N3 and N4 are conducted such that the column of the resistive memory cells 115 corresponding to the bit line BL[n] and the source line SL[n] is selected to perform the write operation.

The detail circuits of the switches P1-P4 and N1-N4 illustrated in FIG. 1 are given for illustrative purposes. Various circuits for performing column selection are within the contemplated scope of the present disclosure. Furthermore, the switches discussed in the present disclosure are given for illustrative purposes. Various types of switches are within the contemplated scope of the present disclosure.

For illustration, each of the resistive memory cells 115 in one of the memory rows is electrically connected to a word line, e.g., one of the word lines WL[0], . . . WL[m−1] and WL[m]. In operation, one of the resistive memory cells 115 in a selected memory column is controlled to be conducted according to a control signal from the corresponding word line to perform the write operation. For illustration, the resistive memory cell 115 in the first memory row in a selected memory columns is controlled to be conducted according to the control signal from the word line WL[0].

In some embodiments, the selection signals WR[0] to WR[n] and MUX[0] to MUX[n] and the control signal transmitted through the word lines WL[0]-WL[m] are generated based on at least address decode information (not labeled). The address decode information reflects the row location of the conducted resistive memory cell 115 in the memory column.

As a result, based on the selection signals and the control signal, one of the resistive memory cells 115 in one of the memory columns is selected to perform write operation. For illustration, when the switches P1, P2, N1 and N2 are conducted according to the selection signal WR[0] and the selection signals MUX[0] and the control signal is transmitted through the word line WL[0], the write operation is performed on the resistive memory cell 115 disposed in the first memory column and the first memory row.

In order to perform the write operation, one of the drivers 120 and 125 is activated by the signals SLD or BLD to provide a write current. Furthermore, the sinkers 130 and 135 that are complimentary to the drivers 120 and 125, respectively, are activated by the signals SLS and BLS, respectively.

For illustration, the driver 120 is controlled to be conducted by the signal SLD to provide a write current Iw1 flowing through one of the source lines corresponding to the selected memory column, e.g., the source line SL[0] to the conducted resistive memory cell 115. The sinker 135 is controlled to be conducted by the signal BLS to sink the write current Iw1 from the conducted resistive memory cell 115 flowing through one of the bit lines corresponding to the selected memory column, e.g., the bit line BL[0]. Under such a condition, the driver 125 and the sinker 130 are disabled by the signals BLD and SLS, respectively.

For another illustration, the driver 125 is controlled to be conducted by the signal BLD to provide the write current Iw2 flowing through one of the bit lines corresponding to the selected memory column, e.g., the bit line BL[0], to the conducted resistive memory cell 115. The sinker 130 is controlled to be conducted by the signal SLS to sink the write current Iw2 from the conducted resistive memory cell 115 flowing through one of the source lines corresponding to the selected memory column, e.g., the source line SL[0]. Under such a condition, the driver 120 and the sinker 135 are disabled by the signals SLD and BLS respectively.

In some embodiment, when the driver 120 and the sinker 135 are used to perform write operation, one of the driver 120 and the sinker 135 has a trimmable resistance. The trimmable resistance is trimmed based on the row location of the conducted resistive memory cell 115 in the memory column.

Figure 2A:
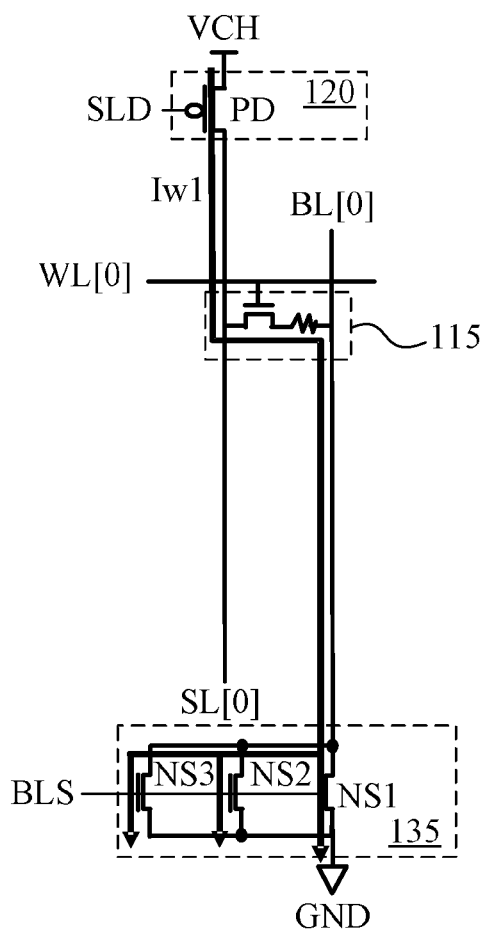
FIG. 2A is a simplified circuit diagram of a portion of the memory device in FIG. 1, in accordance with various embodiments of the present disclosure.
Figure 2B:
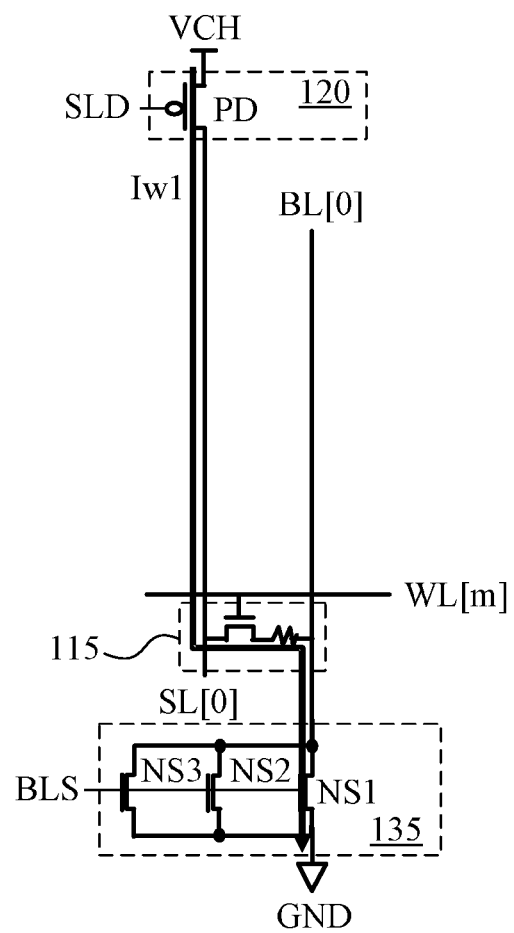
FIG. 2B is a simplified circuit diagram of a portion of the memory device in FIG. 1, in accordance with various embodiments of the present disclosure.

Reference is now made to FIG. 2A and FIG. 2B. FIG. 2A is a simplified circuit diagram of the driver 120, the conducted resistive memory cell 115 corresponding to the word line WL[0], the sinker 135, the source line SL[0] and bit line BL[0], as illustrated in FIG. 1, in accordance with various embodiments of the present disclosure. FIG. 2B is a simplified circuit diagram of the driver 120, the conducted resistive memory cell 115 corresponding to the word line WL[m], the sinker 135, the source line SL[0] and bit line BL[0], as illustrated in FIG. 1, in accordance with various embodiments of the present disclosure.

Illustratively, the driver 120 includes a P-type transistor PD electrically connected to a voltage source VCH. The driver 120 is controlled to be conducted by the signal SLD to provide the write current Iw1.

The sinker 135 includes three parallel-connected resistive units electrically connected to a ground potential GND. For illustration, the resistive units are N-type transistors NS1, NS2 and NS3.

According to different row locations of the conducted resistive memory cell 115, different number of the N-type transistors NS1, NS2 and NS3 is controlled to be conducted by the signal BLS to sink the write current Iw1. In some embodiments, the signal BLS includes a multiple of bits to control the operation of the N-type transistors NS1, NS2 and NS3 respectively.

Illustratively in FIG. 2A, the row location of the conducted resistive memory cell 115 corresponding to the word line WL[0] is closer to the driver 120. Under such a condition, the resistance contributed by the source line SL[0] is smaller than the resistance contributed by the bit line BL[0] along the current flowing path.

As a result, more of the N-type transistors, including, for example, all of the three N-type transistors NS1, NS2 and NS3, are controlled to be conducted. The resistance of the sinker 135 becomes lower accordingly.

Illustratively in FIG. 2B, the row location of the conducted resistive memory cell 115 corresponding to the word line WL[m] is farther from the driver 120. Under such a condition, the resistance contributed by the source line SL[0] is larger than the resistance contributed by the bit line BL[0] along the current flowing path.

As a result, less of the N-type transistors, including, for example, one N-type transistors NS1, is controlled to be conducted. The resistance of the sinker 135 becomes larger accordingly.

In some approaches, when the row locations of the conducted resistive memory cell are different, the ratios between the wire resistances of the source line and the bit line are different. The unbalance between the wire resistances results in different writing voltages applied on the conducted resistive memory cell. Such approaches potentially cause reliability issue.

Compared to the approaches discussed above, the trimmable resistance of the sinker 135 varies according to different row locations of the conducted resistive memory cell 115 in the present disclosure. The unbalance between the wire resistances of the source line and the bit line is compensated. The writing voltages applied on the conducted resistive memory cell 115 corresponding to different row locations are controlled to be within an identical range. The reliability issue is thus improved.

Figure 3A:
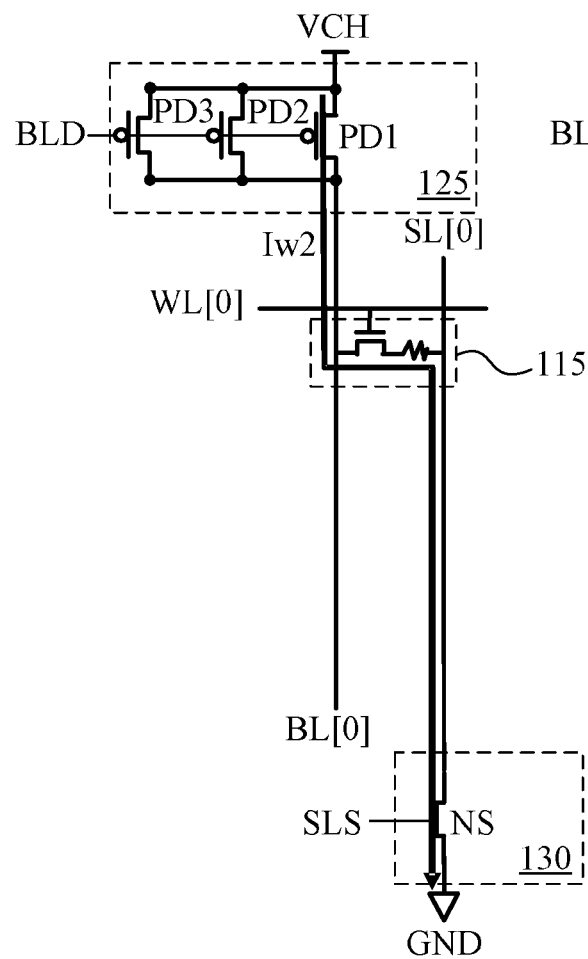
FIG. 3A is a simplified circuit diagram of a portion of the memory device in FIG. 1, in accordance with various embodiments of the present disclosure.
Figure 3B:
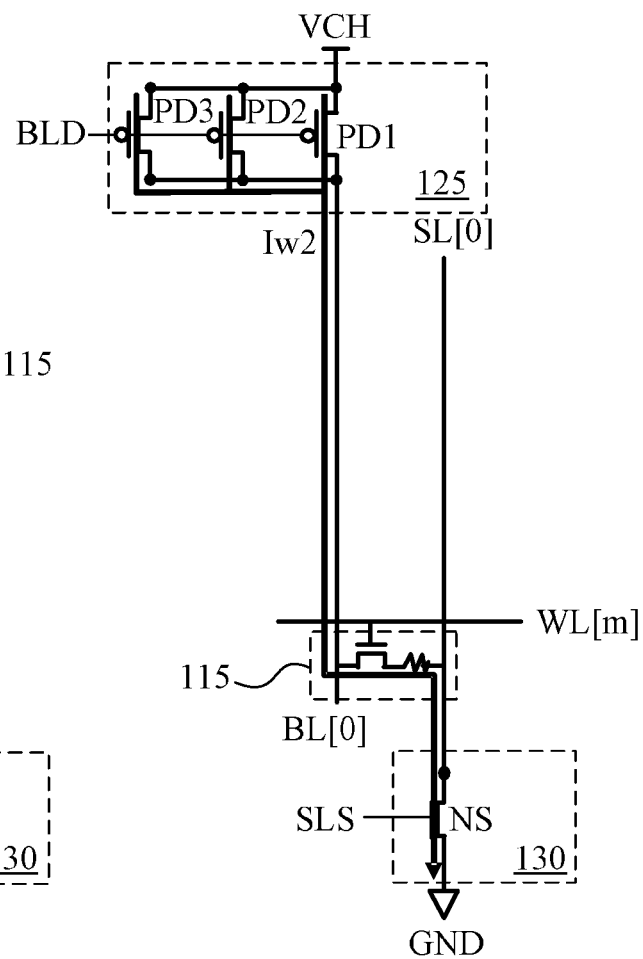
FIG. 3B is a simplified circuit diagram of a portion of the memory device in FIG. 1, in accordance with various embodiments of the present disclosure.

Reference is now made to FIG. 3A. FIG. 3A and FIG. 3B. FIG. 3A is a simplified circuit diagram of the driver 125, the conducted resistive memory cell 115 corresponding to the word line WL[0], the sinker 130, the source line SL[0] and bit line BL[0], as illustrated in FIG. 1, in accordance with various embodiments of the present disclosure. FIG. 3B is a simplified circuit diagram of the driver 120, the conducted resistive memory cell 115 corresponding to the word line WL[m], the sinker 130, the source line SL[0] and bit line BL[0], as illustrated in FIG. 1, in accordance with various embodiments of the present disclosure.

Illustratively, the sinker 130 includes an N-type transistor NS electrically connected to a ground potential GND. The sinker 130 is controlled to be conducted by the signal SLS to sink the write current Iw2.

The driver 125 includes three parallel-connected resistive units electrically connected to a voltage source VCH. For illustration, the resistive units are P-type transistors PD1, PD2 and PD3.

According to different row locations of the conducted resistive memory cell 115, different number of the P-type transistors is controlled to be conducted by the signal BLD to provide the write current Iw2. In some embodiments, the signal BLD includes a multiple of bits to control the operation of the P-type transistors PD1, PD2 and PD3 respectively.

Illustratively in FIG. 3A, the row location of the conducted resistive memory cell 115 corresponding to the word line WL[0] is closer to the driver 125. Under such a condition, the resistance contributed by the bit line BL[0] is smaller than the resistance contributed by the source line SL[0] along the current flowing path.

As a result, less of the number of the P-type transistors, including, for example, only one P-type transistors PD1, is controlled to be conducted. The resistance of the driver 125 becomes larger accordingly.

Illustratively in FIG. 3B, the row location of the conducted resistive memory cell 115 corresponding to the word line WL[m] is farther from the driver 125. Under such a condition, the resistance contributed by the bit line BL[0] is larger than the resistance contributed by the source line SL[0] along the current flowing path.

As a result, more of the number of the P-type transistors, including, for example, all of the three P-type transistors PD1, PD2 and PD3, are controlled to be conducted. The resistance of the driver 125 becomes lower accordingly.

As mentioned above, in some approaches, when the row locations of the conducted resistive memory cell are different, the ratios between the wire resistances of the source line and the bit line are different too. The unbalance between the wire resistances results in different writing voltages applied on the conducted resistive memory cell. Such approaches potentially cause reliability issue.

Compared to the approaches discussed above, the trimmable resistance of the driver 125 varies according to different row locations of the conducted resistive memory cell 115. The unbalance between the wire resistances of the source line and the bit line is compensated. The writing voltages applied on the conducted resistive memory cell 115 corresponding to different row locations are controlled to be within an identical range. The reliability issue is thus improved.

Figure 4A:
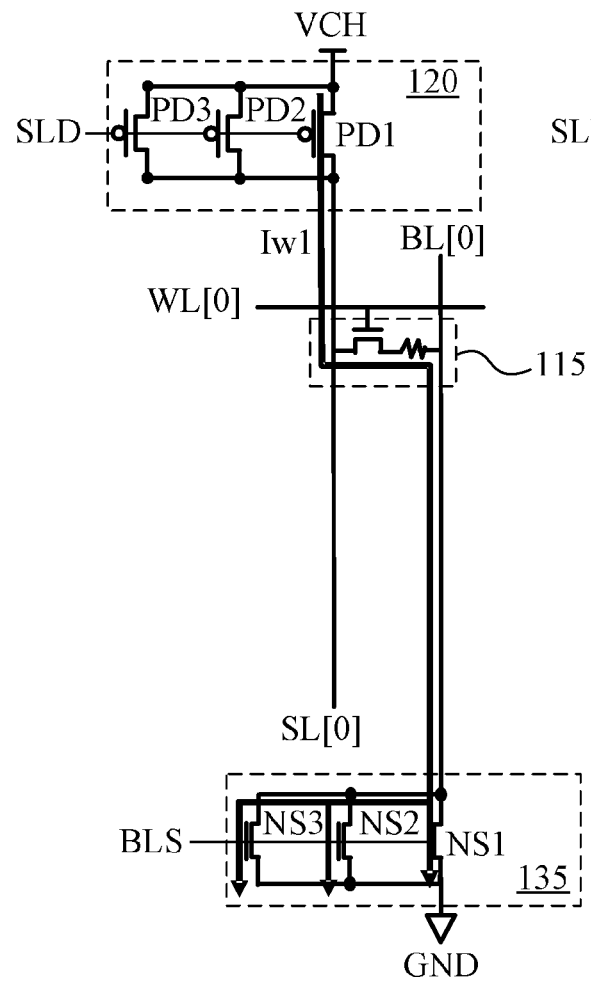
FIG. 4A is a simplified circuit diagram of a portion of the memory device in FIG. 1, in accordance with various embodiments of the present disclosure.
Figure 4B:
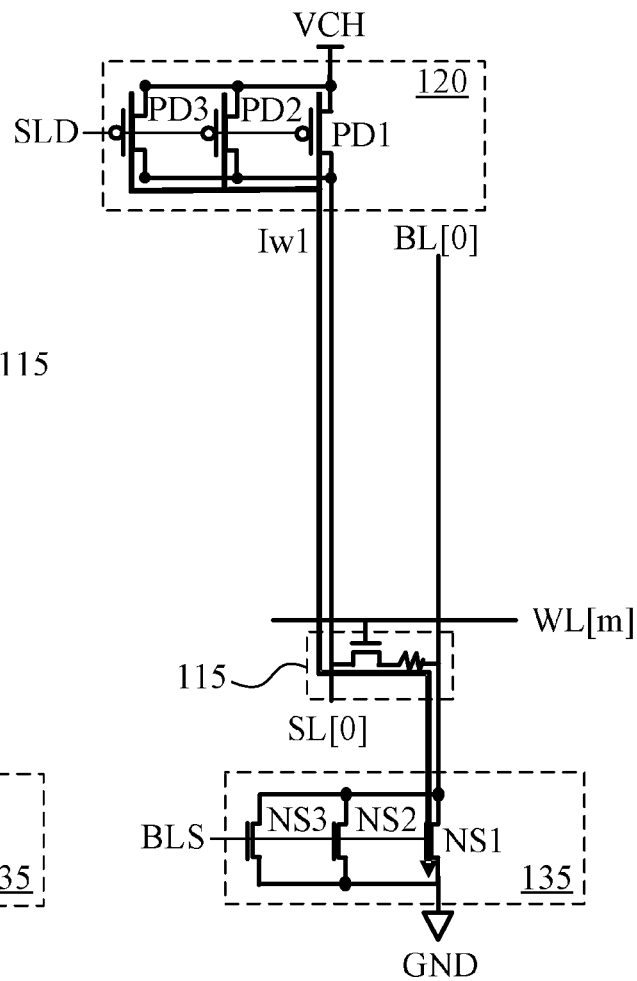
FIG. 4B is a simplified circuit diagram of a portion of the memory device in FIG. 1, in accordance with various embodiments of the present disclosure.

Reference is now made to FIG. 4A and FIG. 4B. FIG. 4A is a simplified circuit diagram of the driver 120, the conducted resistive memory cell 115 corresponding to the word line WL[0], the sinker 135, the source line SL[0] and bit line BL[0], as illustrated in FIG. 1, in accordance with various embodiments of the present disclosure. FIG. 4B is a simplified circuit diagram of the driver 120, the conducted resistive memory cell 115 corresponding to the word line WL[m], the sinker 135, the source line SL[0] and bit line BL[0], as illustrated in FIG. 1, in accordance with various embodiments of the present disclosure.

In some embodiments, both of the driver 120 and the sinker 135 have trimmable resistances. Illustratively, the driver 120 includes three parallel-connected resistive units electrically connected to the voltage source VCH. For illustration, the resistive units are P-type transistors PD1, PD2 and PD3. Moreover, the sinker 135 includes three parallel-connected resistive units electrically connected to the ground potential GND. For illustration, the resistive units are N-type transistors NS1, NS2 and NS3.

According to the row location of the conducted resistive memory cell 115, different number of the N-type transistors in the sinker 135 is controlled to be conducted by the signal BLS to sink the write current Iw1, and different number of the P-type transistors in the driver 120 is controlled to be conducted by the signal SLD to sink the write current Iw1.

Illustratively in FIG. 4A, the row location of the conducted resistive memory cell 115 corresponding to the word line WL[0] is closer to the driver 120. Under such a condition, the resistance contributed by the source line SL[0] is smaller than the resistance contributed by the bit line BL[0] along the current flowing path.

As a result, more of the number of the N-type transistors, including, for example, all of the three N-type transistors NS1, NS2 and NS3 are controlled to be conducted. The resistance of the sinker 135 becomes lower. Moreover, less of the number of the P-type transistors, such as only one P-type transistor PD1 is controlled to be conducted. The resistance of the driver 120 becomes larger accordingly.

Illustratively in FIG. 4B, the row location of the conducted resistive memory cell 115 corresponding to the word line WL[m] is farther from the driver 120. Under such a condition, the resistance contributed by the source line SL[0] is larger than the resistance contributed by the bit line BL[0] along the current flowing path.

As a result, less of the number of the N-type transistors, including, for example, only one N-type transistors NS1 is controlled to be conducted. The resistance of the sinker 135 becomes larger. Moreover, more of the number of the P-type transistors, such as all of the three P-type transistors PD1, PD2 and PD3 are controlled to be conducted. The resistance of the driver 120 becomes smaller accordingly.

As mentioned above, in other approaches, when the row locations of the conducted resistive memory cell 115 are different, the ratios between the wire resistances of the source line and the bit line are different too. The unbalance between the wire resistances results in different writing voltages applied on the conducted resistive memory cell 115. Such approaches potentially cause reliability issue.

Compared to the approaches discussed above, the trimmable resistances of both of the driver 125 and the sinker 135 vary according to different row locations of the conducted resistive memory cell 115. The unbalance between the wire resistances of the source line and the bit line is compensated. The writing voltages applied on the conducted resistive memory cell 115 corresponding to different row locations are controlled to be within an identical range. The reliability issue is thus overcome.

The resistive units implemented by the P-type and N-type transistors illustrated in FIG. 2A, FIG. 2B, FIG. 3A, FIG. 3B, FIG. 4A and FIG. 4B are given for illustrative purposes. Various types of resistive units, including, for example, a metal oxide semiconductor (MOS) transistor, a metal resistor, a poly resistors or a combination of the above, are within the contemplated scope of the present disclosure. Furthermore, various numbers and configurations of the resistive units are within the contemplated scope of the present disclosure.

Figure 5A:
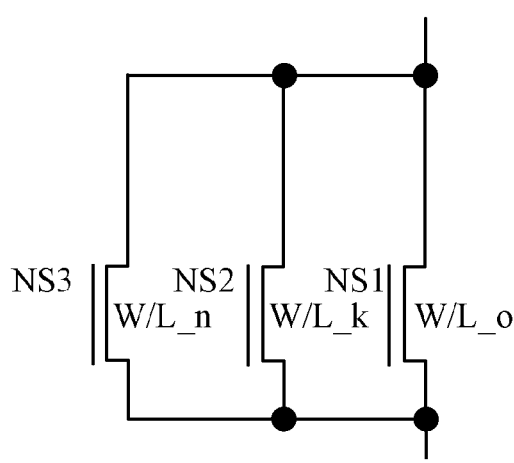
FIG. 5A and FIG. 5B are exemplary variations of the configuration of the sinker in FIG. 1, in accordance with various embodiments of the present disclosure.
Figure 5B:
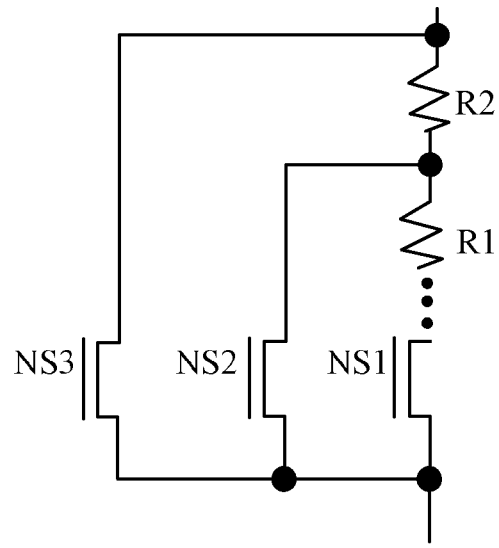
Figure 5C:
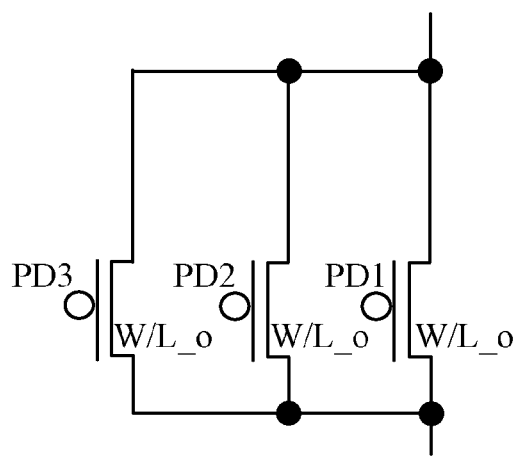
FIG. 5C and FIG. 5D are exemplary variations of the configuration of the driver in FIG. 1, in accordance with various embodiments of the present disclosure.
Figure 5D:
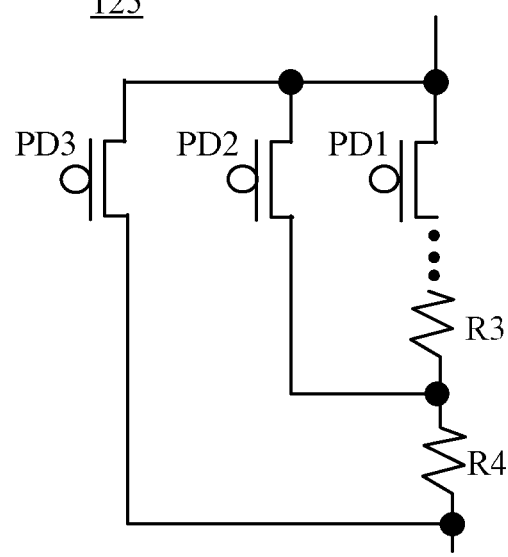

Reference is now made to FIG. 5A to FIG. 5D. FIG. 5A and FIG. 5B are exemplary variations of the configuration of the sinker 135 in FIG. 1, in accordance with various embodiments of the present disclosure. FIG. 5C and FIG. 5D are exemplary variations of the configuration of the driver 125 in FIG. 1, in accordance with various embodiments of the present disclosure.

In some embodiments, in FIG. 5A and FIG. 5C, both of the sinker 135 and the driver 125 include transistors having different dimensions, including, for example, the ratio of the channel width and the channel length (W/L ratio). For illustration, the sinker 135 includes N-type transistors NS1, NS2 and NS3 having the W/L ratio of $W/L\_o$, $W/L\_k$ and $W/L\_n$ respectively, in which $L\_o<L\_k<L\_n$. The driver 125 includes P-type transistors PD1, PD2 and PD3 having the W/L ratio of $W/L\_o$, $W/L\_k$ and $W/L\_n$ respectively, in which $L\_o<L\_k<L\_n$.

With different W/L ratios, the transistors have different resistances. Different combinations of the trimmable resistances of the sinker 135 and the driver 125 are accomplished thereby.

For illustration, in FIG. 5B and FIG. 5D, both of the sinker 135 and the driver 125 include transistors and resistors electrically connected either in series or in parallel. In FIG. 5B, the sinker 135 includes the N-type transistor NS1 electrically connected to a resistor R1 and further electrically connected to the N-type transistor NS2 in parallel. The combination of the N-type transistors NS1, NS2 and the resistor R1 is electrically connected to a resistor R2 in series and further electrically connected to the N-type transistor NS3 in parallel.

In FIG. 5D, the driver 125 includes the P-type transistor PD1 electrically connected to a resistor R3 and further electrically connected to the P-type transistor PD2 in parallel. The combination of the P-type transistors PD1, PD2 and the resistor R3 is electrically connected to a resistor R4 in series and further electrically connected to the P-type transistor PD3 in parallel.

With the connection of the additional resistors, the resistive units including the transistor and the resistor have different resistances. Different combinations of the trimmable resistances of the sinker 135 and the driver 125 are accomplished thereby.

Figure 6:
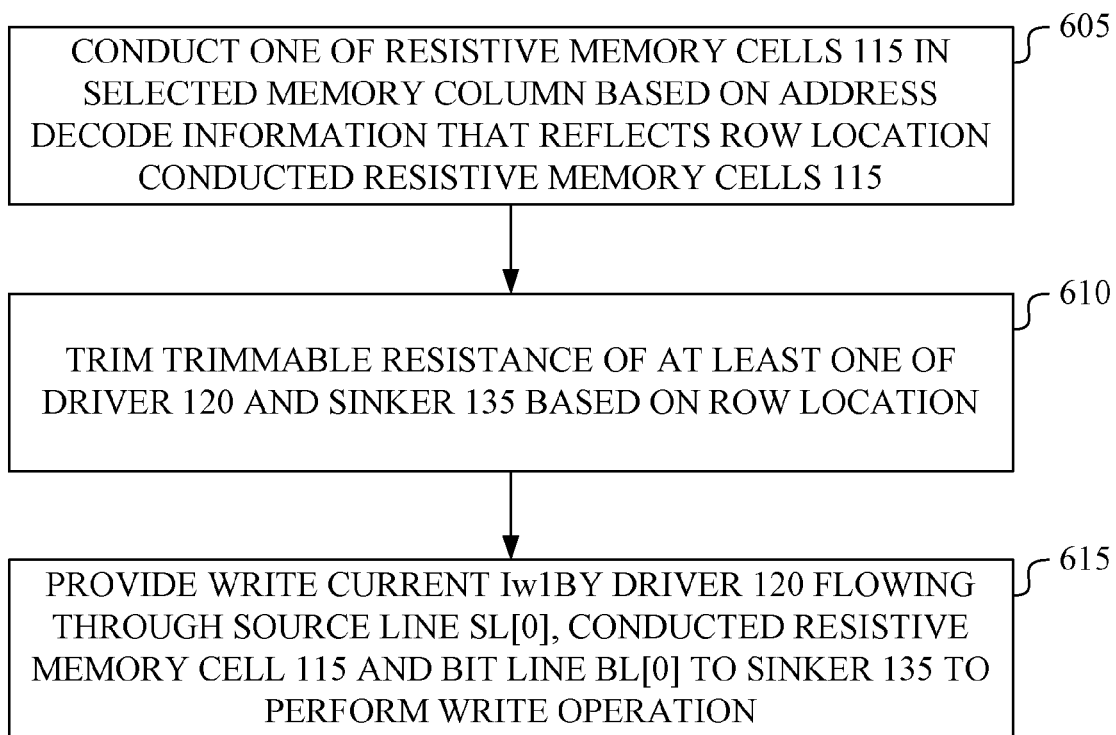
FIG. 6 is a flow chart of a method illustrating the operation of the memory device in FIG. 1, in accordance with various embodiments of the present disclosure.

Reference is now made to FIG. 6. FIG. 6 is a flow chart of a method 600 illustrating the operation of the memory device 100 in FIG. 1, in accordance with various embodiments of the present disclosure. For illustration, the operation of the memory device 100 in FIG. 1 is described by the method 600.

With reference to the method 600 in FIG. 6, in operation 605, one of the resistive memory cells 115 in the selected memory column corresponding to the source line SL[0] and the bit line BL[0], is conducted based on the address decode information that reflects the row location of the conducted resistive memory cell 115 in the memory column.

In operation 610, the trimmable resistance of at least one of the driver 120 and the sinker 135 is trimmed based on the row location.

In operation 615, the driver 120 provides the write current Iw1 flowing through the source line SL[0], the conducted resistive memory cell 115 and the bit line BL[0] to the sinker 135 to perform write operation.

Figure 7:
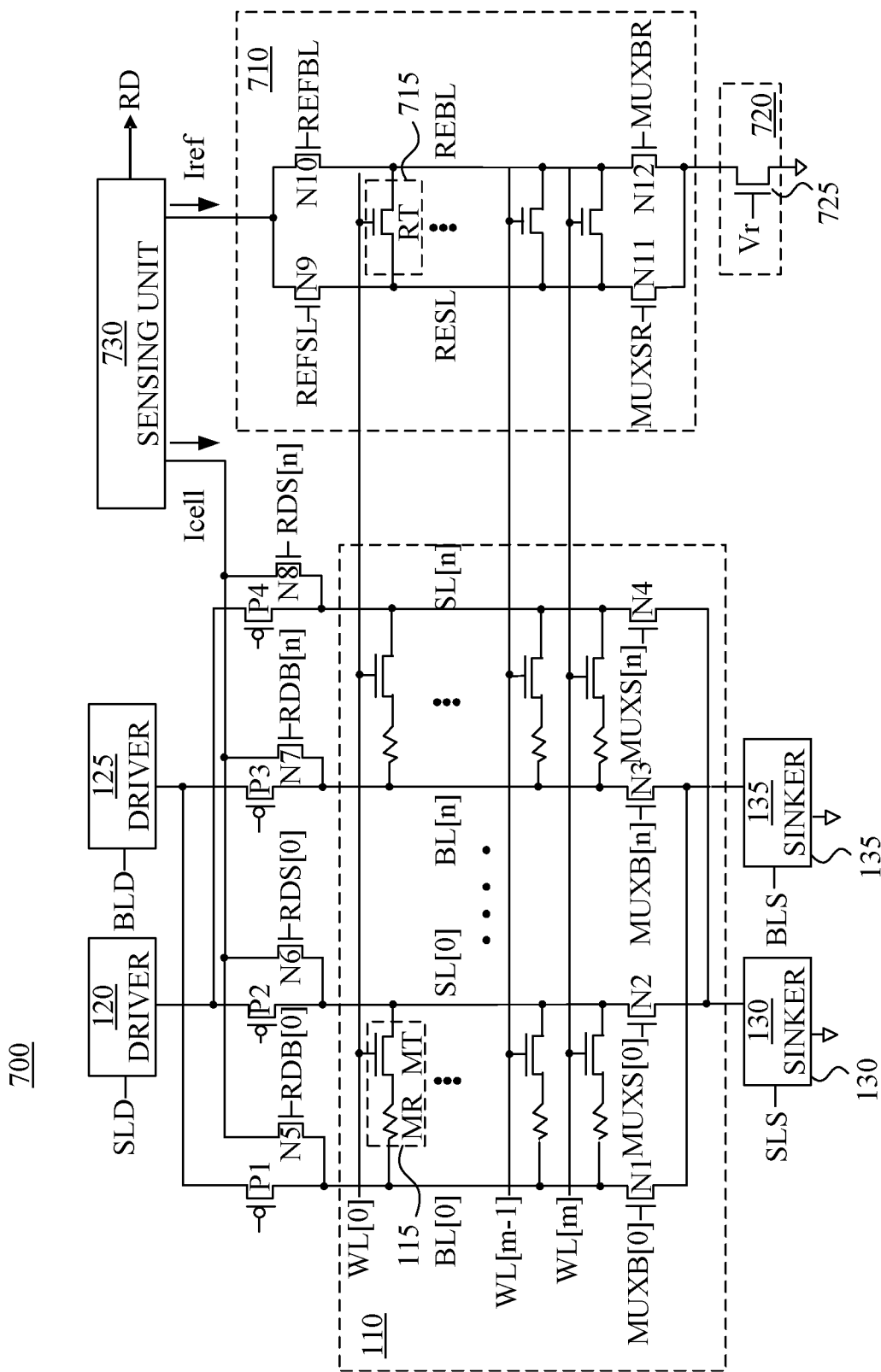
FIG. 7 is a circuit diagram of a memory device in accordance with alternative embodiments of the present disclosure.

Reference is now made to FIG. 7. FIG. 7 is a circuit diagram of a memory device 700 in accordance with alternative embodiments of the present disclosure.

For illustration, the memory device 700 includes the memory array 110 arranged in rows and columns as illustrated in FIG. 1. The memory array 110 includes the resistive memory cells 115 each disposed at an intersection of one of the memory rows and one of the memory columns. The configuration of the memory array 110 illustrated in FIG. 7 is identical to the memory array 110 illustrated in FIG. 1. As a result, the detail description of the memory array 110 is not discussed herein.

Compared to the memory device 100 in FIG. 1, in some embodiments, the memory device 700 further includes a reference column 710. The reference column 710 includes a plurality of reference bit cells 715. In some embodiments, each of the reference bit cells 715 includes a transistor RT and does not have interchangeable resistance states as the resistive memory cells 115.

Moreover, in some embodiments, the memory device 700 further includes a reference resistor 720 electrically connected to the reference column 710. The reference resistor 720 is configured to have a reference resistance between the high state resistance and the low state resistance of the resistive memory cells 115. In some embodiments, the reference resistance is a median value of the high state resistance and the low state resistance of the resistive memory cells 115.

In some embodiments, the reference resistor 720 includes a metal oxide semiconductor (MOS) resistor 725 conducted in a linear region in response to a driving voltage Vr to keep the reference resistance at the median value of the high state resistance and the low state resistance.

The memory device 700 further includes a sensing unit 730. For illustration, each of the resistive memory cells 115 in one of the memory columns is electrically connected to the sensing unit 730 through a source line, e.g., one of the source lines SL[0], . . . and SL[n]. Furthermore, each of the resistive memory cells 115 in one of the memory columns is electrically connected to the sensing unit 730 through a bit line, e.g., one of the bit lines BL[0], . . . and BL[n].

Moreover, each of the reference bit cells 715 is electrically connected to the sensing unit 730 through a reference source line RESL. Furthermore, each of the reference bit cells 715 is electrically connected to the sensing unit 730 through a reference bit line REBL.

In some embodiments, the memory device 700 further includes a plurality groups of switches, and each group corresponds to one column of resistive memory cells 115. For illustration, the group of switches N5, N6, N1 and N2 corresponds to the memory column electrically connected to the bit line BL[0] and the source line SL[0]. The group of switches N7, N8, N3 and N4 corresponds to the memory column electrically connected to the bit line BL[n] and the source line SL[n]. Each group of switches mentioned above is configured for selecting one corresponding column to perform read operation.

For illustration, the switch N5 is electrically connected between the sensing unit 730 and the bit line BL[0]. The switch N5 is under the control of a selection signal RDB[0]. The switch N6 is electrically connected between the sensing unit 730 and the source line SL[0]. The switch N6 is under the control of the selection signal RDS[0].

The switch N1 is electrically connected between the sinker 135 and the bit line BL[0]. The switch N2 is electrically connected between the sinker 130 and the source line SL[0]. The switch N1 and the switch N2 are under the control of the selection signals MUXB[0] and MUXS[0] respectively.

In some embodiments, the switches N1, N2, N5 and N6 are N-type transistors. In operation, when one of the selection signals RDB[0] and RDS[0] is at a high state and a corresponding one of the selection signals MUXB[0] and MUXS[0] is at a high state, one of the switches N1 and N2, and one of the switches N5 and N6 are conducted such that the column of the resistive memory cells 115 corresponding to the bit line BL[0] and the source line SL[0] is selected to perform the read operation.

For example, when the selection signals RDS[0] and MUXB[0] are at the high state and the selection signals RDB[0] and MUXS[0] are at the low state, the switches N6 and N1 are conducted while the switches N5 and N2 are off such that a read current (not illustrated) flows through the switch N6, the source line SL[0], the resistive memory cell 115 activated by the corresponding word line, the bit line BL[0], the switch N1 and further to the sinker 135 to accomplish the source line read operation.

On the other hand, when the selection signals RDB[0] and MUXS[0] are at the high state and the selection signals RDS[0] and MUXB[0] are at the low state, the switches N5 and N2 are conducted while the switch N6 and N1 are off such that a read current (not illustrated) flows through the switch N5, the bit line BL[0], the resistive memory cell 115 activated by the corresponding word line, the source line SL[0], the switch N2 and further to the sinker 130 to accomplish the bit line read operation.

For illustration, the switch N7 is electrically connected between the sensing unit 730 and the bit line BL[n]. The switch N7 is under the control of a selection signal RDB[n]. The switch N8 is electrically connected between the sensing unit 730 and the source line SL[n]. The switch N8 is under the control of the selection signal RDS[n].

The switch N3 is electrically connected between the sinker 135 and the bit line BL[n]. The switch N4 is electrically connected between the sinker 130 and the source line SL[n]. The switch N3 and the switch N4 are under the control of the selection signals MUXB[n] and MUXS[n] respectively.

In some embodiments, the switches N3, N4, N7 and N8 are N-type transistors. In operation, when one of the selection signals RDB[n] and RDS[n] is at a high state and a corresponding one of the selection signals MUXB[n] and MUXS[n] is at a high state, one of the switches N3 and N4, and one of the switches N7 and N8 are conducted such that the column of the resistive memory cells 115 corresponding to the bit line BL[n] and the source line SL[n] is selected to perform the read operation.

For illustration, when the selection signals RDS[n] and MUXB[n] are at the high state and the selection signals RDB[n] and MUXS[n] are at the low state, the switches N8 and N3 are conducted while the switches N7 and N4 are off such that a read current (not illustrated) flows through the switch N8, the source line SL[n], the resistive memory cell 115 activated by the corresponding word line, the bit line BL[n], the switch N3 and further to the sinker 135 to accomplish the source line read operation.

On the other hand, when the selection signals RDB[n] and MUXS[n] are at the high state and the selection signals RDS[n] and MUXB[n] are at the low state, the switches N7 and N4 are conducted while the switches N8 and N3 are off such that a read current (not illustrated) flows through the switch N7, the bit line BL[n], the resistive memory cell 115 activated by the corresponding word line, the source line SL[n], the switch N4 and further to the sinker 130 to accomplish the bit line read operation.

The detail circuits of the switches N1-N8 illustrated in FIG. 7 are given for illustrative purposes. Various circuits for performing column selection are within the contemplated scope of the present disclosure.

In some embodiments, the memory device 700 further includes a group of switches each for selecting the reference column 710 to perform read operation.

For illustration, the switch N9 is electrically connected between the sensing unit 730 and the reference source line RESL. The switch N9 is under the control of a selection signal REFSL. The switch N10 is electrically connected between the sensing unit 730 and the reference bit line REBL. The switch N10 is under the control of a selection signal REFBL.

The switch N11 is electrically connected between the reference resistor 720 and the reference source line RESL. The switch N12 is electrically connected between the reference resistor 720 and the reference bit line REBL. The switch N11 and the switch N12 are under the control of selection signals MUXSR and MUXBR.

In some embodiments, the switches N9, N10, N11 and N12 are N-type transistors. In operation, when one of the selection signals REFSL and REFBL is at a high state and a corresponding one of the selection signal MUXSR and MUXBR is at a high state, one of the switches N9 and N10 and one of the switches N11 and N12 are conducted such that the reference column 710 is selected to perform the read operation.

For illustration, each of the resistive memory cells 115 in one of the memory rows is electrically connected to a word line, e.g. one of the word lines WL[0], . . . WL[m−1] and WL[m].

In operation, one of the resistive memory cells 115 in a memory column is controlled to be conducted according to a control signal from the corresponding word line to perform the read operation. For example, the resistive memory cell 115 in the first memory row in a selected memory columns, e.g. the first memory column, is controlled to be conducted according to the control signal from the word line WL[0].

Moreover, each of the reference bit cells 715 corresponding to one of the memory rows is electrically connected to a word line, e.g., one of the word lines WL[0], . . . WL[m−1] and WL[m].

In operation, one of the reference bit cells 715 in the reference column 710 is controlled to be conducted according to the control signal from the corresponding word line to perform the write operation. For example, the reference bit cells 715 in the first memory row is controlled to be conducted according to the control signal from the word line WL[0].

In some embodiment, the selection signals RDB[0], RDS[0], RDB[n], RDS[n], REFSL, REFBL, MUXB[0] to MUXB[n], MUXS[0] to MUXS[n], MUXSR and MUXBR are generated based on the address decode information.

As a result, based on the selection signals and the control signal, one of the resistive memory cells 115 is selected to perform read operation. For example, when one of the switches N1, N2 and one of the switches N5 and N6 are conducted according to the selection signals RDB[0], RDS[0], MUXB[0] and MUXS[0], and the control signal is transmitted through the word line WL[0], the read operation is performed based on the resistive memory cell 115 disposed in the first memory column and the first memory row.

Moreover, based on the selection signals and the control signal, one of the reference bit cells 715 is selected to perform read operation. When one of the switches N9 and N10 and one of the switches N11 and N12 are conducted according to the selection signal REFSL, REFBL, MUXSR and MUXBR and the control signal is transmitted through the word line WL[0], the read operation is performed based on the reference bit cells 715 disposed in the reference column 710.

For illustration, when the selection signals REFSL and MUXBR are at the high state and the selection signals REFBL and MUXSL are at the low state, the switches N9 and N12 are conducted while the switches N10 and N11 are off. Accordingly, a read current (not labeled) flows through the switch N9, the reference source line RESL, the reference bit cell 715 activated by the corresponding word line, the reference bit line REBL, the switch N12 and further to the reference resistor 720. As a result, the source line read operation is accomplished.

On the other hand, when the selection signals REFBL and MUXSL are at the high state and the selection signals REFSL and MUXBR are at the low state, the switches N10 and N11 are conducted while the switches N9 and N12 are off. Accordingly, a read current (not labeled) flows through the switch N10, the reference bit line REBL, the reference bit cell 715 activated by the corresponding word line, the reference source line RESL, the switch N11 and further to the reference resistor 720. As a result, the bit line read operation is accomplished.

In operation, when one of the resistive memory cells 115 and a positionally corresponding one of the reference bit cells 715 are conducted based on an address decode information, the sensing unit 730 is configured to sense a read current Icell drained by the selected memory columns, and to sense a reference current Iref drained by the reference column 710 and the reference resistor 720. The sensing unit 730 further performs comparison between the read current Icell and the reference current Iref to determine the resistance state of the conducted resistive memory cell 115.

In some embodiments, the conducted resistive memory cell 115 is determined to have the low state resistance when the read current Icell is larger than the reference current Iref. The conducted resistive memory cell 115 is determined to have the high state resistance when the comparator determines that the read current Icell is smaller than the reference current Iref.

Figure 8:
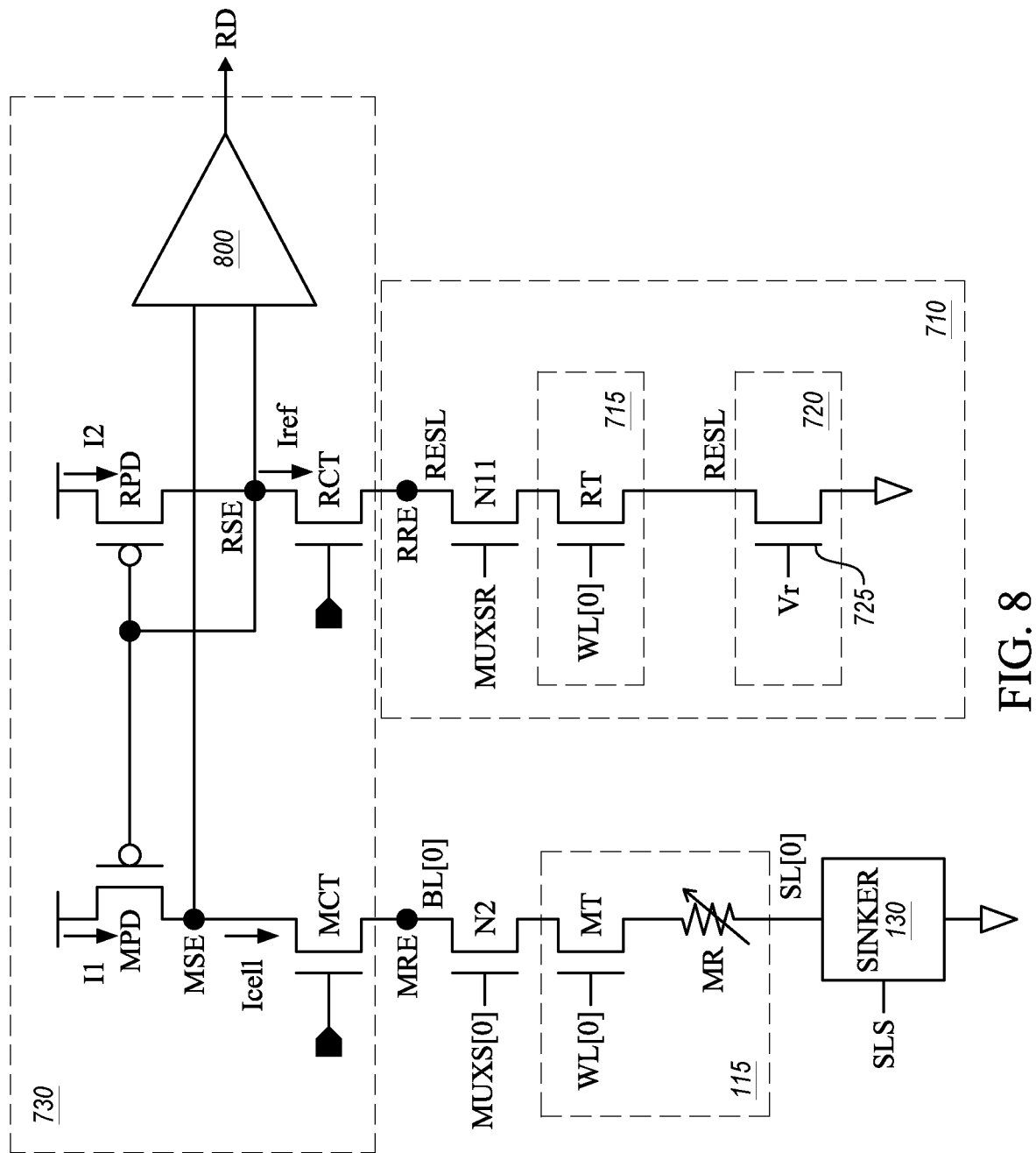
FIG. 8 is a circuit diagram of a simplified portion of the memory device in FIG. 1, in accordance with various embodiments of the present disclosure.

Reference is now made to FIG. 8. FIG. 8 is a circuit diagram of the simplified selected memory column, e.g., the memory column corresponding to the source line SL[0] and the bit line BL[0], the simplified reference column 710 and the sensing unit 730, in accordance with various embodiments of the present disclosure.

For illustration, the conducted resistive memory cell 115, the switch N1, the source line SL[0] and the bit line BL[0] corresponding to the selected memory column are exemplarily illustrated. The conducted reference bit cells 715, the reference resistor 720, the switch N11, the reference bit line REBL and the reference source line RESL corresponding to the reference column 710 are exemplarily illustrated.

The sensing unit 730 includes a memory driver MPD and a reference driver RPD. In some embodiments, each of the memory driver MPD and the reference driver RPD includes a P-type transistor and the memory driver MPD and the reference driver RPD are electrically connected as a current mirror. In some embodiments, the memory driver MPD and the reference driver RPD have identical dimensions to have identical driving ability.

Each of the resistive memory cells 115, e.g., the resistive memory cell 115 illustrated in FIG. 8, is electrically connected to the memory driver MPD to drain the current from the memory driver MPD as the read current Icell. Each of the reference bit cells 715, e.g., the reference bit cell 715 illustrated in FIG. 8, is electrically connected to the reference driver RPD to drain the current from the reference driver RPD as the reference current Iref.

The sensing unit 730 further includes a memory clamping transistors MCT electrically connected to the bit line BL[0] through a memory read node MRE and to the memory driver MPD through a memory sensing node MSE. In operation, the memory clamping transistor MCT is configured to clamp the memory read node MRE at a fixed read voltage when the memory driver MPD provides a first current I1 to the bit line BL[0].

The sensing unit 730 further includes a reference clamping transistor RCT electrically connected to the reference bit line REBL through a reference read node RRE and to the reference driver RPD through a reference sensing node RSE. In operation, the reference clamping transistor RCT is configured to clamp the reference read node RRE at the same fixed read voltage when the reference driver RPD provides a second current I2 that is identical to the first current I1.

The sensing unit 730 further includes a comparator 800 configured to sense the voltage difference between the memory sensing node MSE and the reference sensing node RSE. The read current Icell and the reference current Iref flow through the memory sensing node MSE and the reference sensing node RSE, respectively.

When the conducted resistive memory cell 115 has the low state resistance, the resistance of the conducted resistive memory cell 115 becomes smaller than the resistance of the reference resistor 720. Accordingly, the voltage at the memory sensing node MSE becomes smaller than the voltage at the reference sensing node RSE.

On the contrary, when the conducted resistive memory cell 115 has the high state resistance, the resistance of the conducted resistive memory cell 115 becomes larger than the resistance of the reference resistor 720. Accordingly, the voltage at the memory sensing node MSE becomes larger than the voltage at the reference sensing node RSE.

Based on the comparison between the voltages at the memory sensing node MSE and the reference sensing node RSE, the sensing unit 730 determines the resistance state of the conducted resistive memory cell 115.

In some embodiments, the sensing unit 730 generates a readout signal RD having a low state when the voltage at the memory sensing node MSE is smaller than the voltage at the reference sensing node RSE. Moreover, the sensing unit 730 generates the readout signal RD having a high state when the voltage at the memory sensing node MSE is larger than the voltage at the reference sensing node RSE.

In some approaches, two reference columns are used, in which each of them includes high resistance state reference cells and low resistance state reference cells. The reference current is generated according to the two reference columns corresponding to the median value of the high state resistance and the low state resistance. In such approaches, the read margin is eroded due to the process variation between the two reference columns.

Compared to the approaches discussed above, the reference resistor 720 is used to manipulate the resistance having the median value of the high state resistance and the low state resistance. With the reference resistor 720, there is no issue about the process variation between different reference columns. Not only the components and the area of the reference column are much fewer, but also the read margin improves since.

Moreover, the resistances contributed by the conducted reference bit cell 715, the reference bit line REBL and the reference source line RESL are identical to the resistances contributed by the conducted resistive memory cell 115, the bit line BL[0] and the source line SL[0]. As a result, no matter where the location of the conducted resistive memory cell 115 is, the accuracy of the comparison between the read current Icell and the reference current Iref is maintained.

The reference resistor 720 having one metal oxide semiconductor (MOS) 725 illustrated in FIG. 7 and FIG. 8 is given for illustrative purposes. Various numbers and configurations of the metal oxide semiconductor (MOS) resistors are within the contemplated scope of the present disclosure. For example, in various embodiments, a multiple of parallel-connected metal oxide semiconductor (MOS) resistors are included in the reference resistor 720. Accordingly, the resistance is fine-tuned according to the number of the metal oxide semiconductor (MOS) resistors controlled to be conducted.

Figure 9:
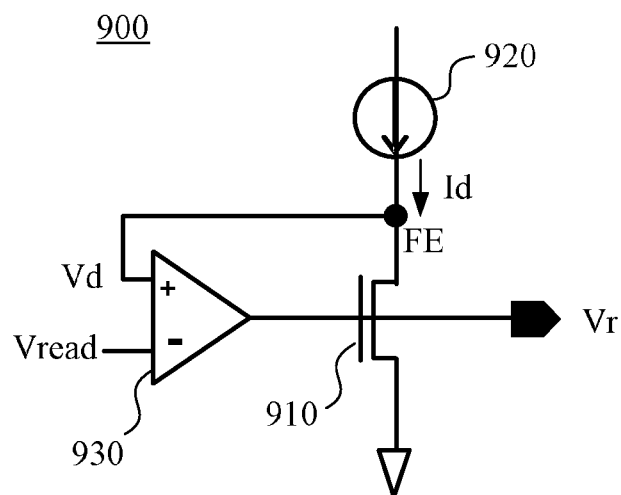
FIG. 9 is a circuit diagram of a resistor driving unit for driving the reference resistor in FIG. 8, in accordance with various embodiments of the present disclosure.

In some embodiments, the operation of the reference resistor 720 is controlled by a resistor driving unit (as labeled in FIG. 9). Various units or circuits to control the operation of the reference resistor 720 are within the contemplated scope of the present disclosure.

Reference is now made to FIG. 9. FIG. 9 is a circuit diagram of the resistor driving unit 900 for driving the reference resistor 720 in FIG. 8, in accordance with various embodiments of the present disclosure.

For illustration, the resistor driving unit 900 includes a driving metal oxide semiconductor resistor 910 identical to the metal oxide semiconductor resistor 725 in the reference resistor 720. Moreover, the driving metal oxide semiconductor resistor 910 is conducted in the linear region in response to the driving voltage Vr that conducts the metal oxide semiconductor resistor 725.

The resistor driving unit 900 further includes a current source 920 having the same driving ability as the reference driver RPD and configured to provide a current I3 to the driving metal oxide semiconductor resistor 910 through a feedback node FE. In some embodiments, the current source 920 has a non-zero temperature coefficient such that the current Id is fine-tuned along different environment conditions.

The resistor driving unit 900 further includes a driving comparator 930 to compare a feedback voltage Vd of the feedback node FE and a preset voltage Vread to generate the driving voltage Vr.

Figure 10:
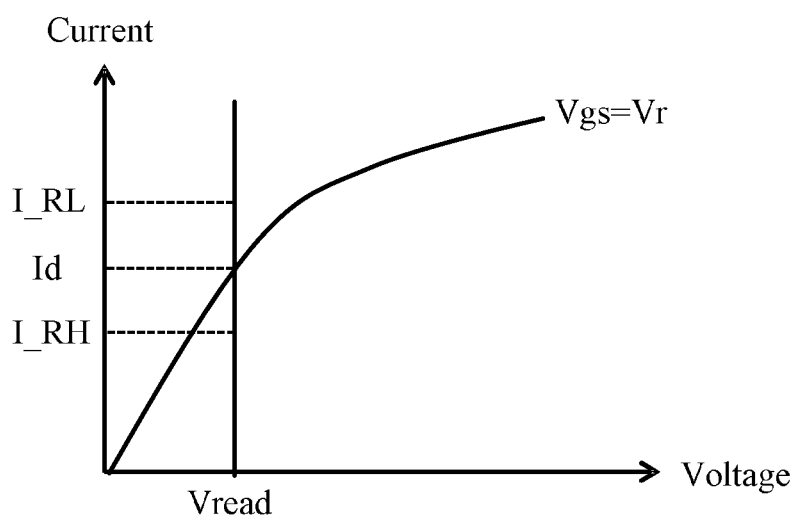
FIG. 10 is a current to voltage curve of the operation of the driving metal oxide semiconductor resistor in FIG. 9, in accordance with various embodiments of the present disclosure.

Reference is now made to FIG. 10 with reference to FIG. 9. FIG. 10 is a current to voltage (I-V) curve of the operation of the driving metal oxide semiconductor resistor 910 in FIG. 9, in accordance with various embodiments of the present disclosure.

Illustratively, the driving metal oxide semiconductor resistor 910 is operated in the linear region, in which the gate to source voltage Vgs of the driving metal oxide semiconductor resistor 910 is the driving voltage Vr. As a result, the preset voltage Vread is predetermined such that the current Id flowing through the driving metal oxide semiconductor resistor 910 is fixed at a median value of a value I_RL and a value I_RH.

In some embodiments, the value I_RL is equivalent to the amount of the read current Icell when the conducted resistive memory cell 115 has the low state resistance. The value I_RH is equivalent to the amount of the read current Icell when the conducted resistive memory cell 115 has the high state resistance. As a result, the resistance of the driving metal oxide semiconductor resistor 910 is controlled to be the median value of the low state resistance and the high state resistance.

As discussed above, the metal oxide semiconductor resistor 725 is identical to the driving metal oxide semiconductor resistor 910. Accordingly, the resistance of the metal oxide semiconductor resistor 725 is controlled to be the median value of the low state resistance and the high state resistance as well.

The configuration of the resistor driving unit 900 for driving the reference resistor 720 illustrated in FIG. 9 is given for illustrative purposes. Various configurations are within the contemplated scope of the present disclosure.

The operations of the components in the present disclosure are given for illustrative purposes. Various operations of the components in the present disclosure are within the contemplated scope of the present disclosure. For example, the components associated with the write operation, discussed in the present disclosure, are able to operate correspondingly in read operation, and the components associated with the read operation, discussed in the present disclosure, are able to operate correspondingly in write operation.

In some embodiments, a device is disclosed that includes a driver and a plurality of resistive memory cells each being electrically connected to the driver through a first line. The driver has a variable resistance corresponding to various locations of a conducted resistive memory cell, relative to the driver, in the plurality of resistive memory cells.

Also disclosed is a device that includes a memory cell in a first column and a reference cell in a second column, and a reference resistor. The reference cell is coupled to the memory cell through a word line. The reference resistor is coupled to the reference cell and configured to operate in response to a driving voltage. The driving voltage is associated with a preset voltage and a feedback voltage that is generated when a current flows through a first resistor. The reference resistor includes a second resistor, and the first and second resistors are controlled to have a resistance which equals a median value of a low state resistance and a high state resistance of the memory cell.

Also disclosed is a method that includes selectively, according to a row location of a memory cell in a column, conducting a number of multiple first parallel-connected MOS transistors of a first type and a number of multiple second parallel-connected MOS transistors of a second type. The memory cell is coupled between the first and second parallel-connected MOS transistors through a first line and a second line. When the memory cell approaches the first parallel-connected MOS transistors, the number of the first parallel-connected MOS transistors being conducted is different from the number of the second parallel-connected MOS transistors being conducted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first memory cell and a second memory cell;
   a first pair of a driver and a sinker, wherein the first memory cell is coupled between the first pair of the driver and the sinker through a first line and a second line; and
   a second pair of a driver and a sinker, wherein the second memory cell is coupled between the second pair of the driver and the sinker through a third line and a fourth line;
   wherein when the first memory cell in a memory column approaches the sinker of the first pair of the driver and the sinker,
   the driver, in the first pair of the driver and the sinker, is configured to be controlled to have a decreased resistance and
   the sinker, in the first pair of the driver and the sinker, is configured to be controlled to have an increased resistance.

2. The device of claim 1, wherein when the second memory cell approaches the driver in the second pair of the driver and the sinker, a variable resistance of the driver in the second pair of the driver and the sinker increases.

3. The device of claim 1, wherein the driver in the first pair of the driver and the sinker comprises
at least one first resistive element of a first conductivity type, coupled to the first line;
wherein the sinker in the first pair of the driver and the sinker comprises:
at least one second resistive element of a second conductivity type different from the first conductivity type, coupled to the second line.

4. The device of claim 3, wherein the at least one second resistive element comprises a plurality of second resistive elements, and the sinker in the first pair of the driver and the sinker is configured to have various resistances provided by conducting various numbers of the plurality of second resistive elements;
wherein when the first memory cell approaches the sinker in the first pair of the driver and the sinker, less number of the plurality of second resistive elements are conducted, compared with a number of the plurality of second resistive elements being conducted when the first memory cell approaches the driver in the first pair of the driver and the sinker.

5. The device of claim 1, wherein in a write operation, one of the first and second pairs of the driver and the sinker is activated, and the other one is disabled.

6. The device of claim 1, further comprising:
a sensing unit coupled to the first to fourth lines through a plurality of switches, and configured to generate, based on a read current corresponding to one of the first and second memory cells, and a reference current corresponding to a reference resistance and a conducted reference bit cell in a plurality of reference bit cells, a readout signal indicating a resistance state of the one of the first and second memory cells; and
a reference resistor configured to transmit the reference current through the conducted reference bit cell in the plurality of reference bit cells, and configured to operate, in response to a driving voltage to have a reference resistance.

7. The device of claim 6, wherein the driving voltage is generated by comparing a preset voltage with a feedback voltage that is generated when a current flows through a driving resistor,
wherein the reference resistor comprises at least one MOS transistor configured to operate as the driving resistor and to be conducted in a linear region in response to the driving voltage.

8. The device of claim 1, further comprising:
a first switch coupled between the first line and the driver in the first pair of the driver and sinker; and
a second switch coupled between the third line and the driver in the second pair of the driver and sinker;
wherein the first and second switches are configured to be controlled by a selection signal.

9. A device, comprising:
a memory cell in a first column and a reference cell in a second column, wherein the reference cell is coupled to the memory cell through a word line; and
a reference resistor coupled to the reference cell and configured to operate in response to a driving voltage, wherein the driving voltage is associated with a preset voltage and a feedback voltage that is generated when a current flows through a first metal oxide semiconductor (MOS) resistor,
wherein the first MOS resistor is configured to be conducted in a linear region in response to the driving voltage,
wherein the reference resistor comprises a second MOS resistor, and the first and second MOS resistors are configured to be controlled to have a resistance which equals a median value of a low state resistance and a high state resistance of the memory cell.

10. The device of claim 9, further comprising:
a memory driver electrically connected to the memory cell through a memory line; and
a memory clamping transistor electrically connected to the memory line through a memory read node and to the memory driver through a memory sensing node, wherein the memory clamping transistor is configured to clamp the memory read node at a fixed read voltage.

11. The device of claim 9, further comprising:
a reference driver electrically connected to the reference resistor through the reference cell and a reference line; and
a reference clamping transistor electrically connected to the reference line through a reference read node and to the reference driver through a reference sensing node, wherein the reference clamping transistor is configured to clamp the reference read node at a fixed read voltage.

12. The device of claim 9, further comprises:
a memory driver electrically connected to the memory cell through a memory line;
a reference driver electrically connected to the reference resistor through the reference cell and a reference line, wherein the memory driver and the reference driver are electrically connected as a current mirror; and
a comparator coupled to the memory driver at a memory sensing node and coupled to the reference driver at a reference sensing node, wherein the comparator is configured to sense a voltage difference between the memory sensing node and the reference sensing node to obtain a state of the memory cell.

13. The device of claim 9, further comprising:
a sinker coupled to the memory cell through a source line;
wherein the sinker has a variable resistance corresponding to various locations of the memory cell in the first column.

14. The device of claim 13, wherein when the various locations of the memory cell approach the sinker, the variable resistance of the sinker increases.

15. The device of claim 9, further comprising:
a driving comparator configured to compare the feedback voltage with the preset voltage to generate the driving voltage.

16. The device of claim 9, further comprising:
a memory clamping transistor electrically connected to the memory cell through a memory read node and configured to clamp the memory read node at a fixed read voltage; and
a reference clamping transistor electrically connected to the reference cell through a reference read node and configured to clamp the reference read node at the fixed read voltage.

17. A method, comprising:
selectively, according to a row location of a memory cell in a column, conducting a number of a plurality of first parallel-connected metal oxide semiconductor (MOS) transistors of a first type and a number of a plurality of second parallel-connected MOS transistors of a second type different from the first type,
wherein the memory cell has a first terminal coupled to the plurality of first parallel-connected MOS transistors, and a second terminal coupled to the plurality of second parallel-connected MOS transistors;

wherein when the memory cell approaches the plurality of first parallel-connected MOS transistors, the number of the plurality of first parallel-connected MOS transistors being conducted decreases and the number of the plurality of second parallel-connected MOS transistors being conducted increases.

18. The method of claim 17, wherein conducting the number of the plurality of first parallel-connected MOS transistors and the number of the plurality of second parallel-connected MOS transistors comprises:
when the memory cell approaches the plurality of second parallel-connected MOS transistors, decreasing the number of the plurality of first parallel-connected MOS transistors being conducted.

19. The method of claim 17, further comprising:
determining the memory cell to have a high state resistance or a low state resistance according to comparing a first current with a second current,
wherein the first current is a current drained by the memory cell from a sensing unit, and the second current is a current drained by a reference cell of a plurality of reference bit cells from the sensing unit.

20. The method of claim 19, further comprising:
adjusting a resistance of a reference resistor, which transmits the second current, by a driving voltage, wherein the driving voltage is associated with a preset voltage and a feedback voltage that is generated when a current flows through a first resistor.

* * * * *